United States Patent [19]

DePinto et al.

[11] Patent Number: 5,024,972
[45] Date of Patent: Jun. 18, 1991

[54] DEPOSITION OF A CONDUCTIVE LAYER FOR CONTACTS

[75] Inventors: Gary A. DePinto; Joe Steinberg; John G. Franka; Michael R. Cherniawski, all of Austin, Tex.

[73] Assignee: Motorola, Inc., Schaumburg, Ill.

[21] Appl. No.: 471,451

[22] Filed: Jan. 29, 1990

[51] Int. Cl.$^5$ .......................................... H01L 21/469
[52] U.S. Cl. .................................. 437/233; 437/191; 437/926; 437/109; 148/DIG. 25; 148/DIG. 124; 148/DIG. 122
[58] Field of Search ............... 437/233, 191, 193, 234, 437/926, 966, 967, 108, 109, 946; 148/DIG. 25, DIG. 122, DIG. 124

[56] References Cited

U.S. PATENT DOCUMENTS

| | | | |
|---|---|---|---|
| 3,847,686 | 11/1974 | Stein | 437/946 |
| 3,867,494 | 2/1975 | Teich et al. | 148/DIG. 122 |
| 3,881,242 | 5/1975 | Nuttall et al. | 437/193 |
| 3,956,037 | 5/1976 | Ishii et al. | 437/946 |
| 4,087,571 | 5/1978 | Kamins et al. | 148/DIG. 122 |
| 4,194,934 | 3/1980 | Blaske et al. | 437/233 |
| 4,702,937 | 10/1987 | Yamoto et al. | 437/233 |
| 4,742,020 | 5/1988 | Roy | 437/233 |
| 4,808,555 | 2/1989 | Mauntel et al. | 437/193 |
| 4,877,753 | 10/1989 | Freeman | 437/233 |
| 4,897,360 | 1/1990 | Guckel et al. | 437/109 |

OTHER PUBLICATIONS

Silicon Processing for VLSI; Wolf et al; vol. 1-Process Technology, pp. 169-170 & pp. 175-189; 1986.
Chemically Vapor Deposited Poly-Si Films; Kamins; IEEE, vol. PHP10, No. 4; Dec. 74; pp. 221-229.

Primary Examiner—Brian E. Hearn
Assistant Examiner—Michael Trinh
Attorney, Agent, or Firm—James L. Clingan, Jr.

[57] ABSTRACT

A polysilicon layer may need to have electrical characteristics which are relatively uniform from wafer to wafer. The use of polysilicon as a resistor is one such example. In order to obtain the requisite uniformity, the temperature of the wafers which are receiving the polysilicon must all be the same within a tight tolerance. The reaction takes place in a furnace which takes a long time to reach the requisite temperature tolerance. While the furnace is stabilizing the temperature, oxide, which is an insulator, is growing on the contact locations of the various substrates. To minimize the deleterious oxide formation, a thin layer of polysilicon is deposited at a time significantly prior to the time that the furnace stabilizes which ensures a good, low-resistance contact. The remainder of the polysilicon is then deposited on the thin layer of polysilicon after the temperature has stabilized to obtain the requisite wafer-to-wafer resistance uniformity. The result is consistently low-resistance contacts and wafer-to-wafer uniformity for the resistance of the resistors.

13 Claims, 2 Drawing Sheets

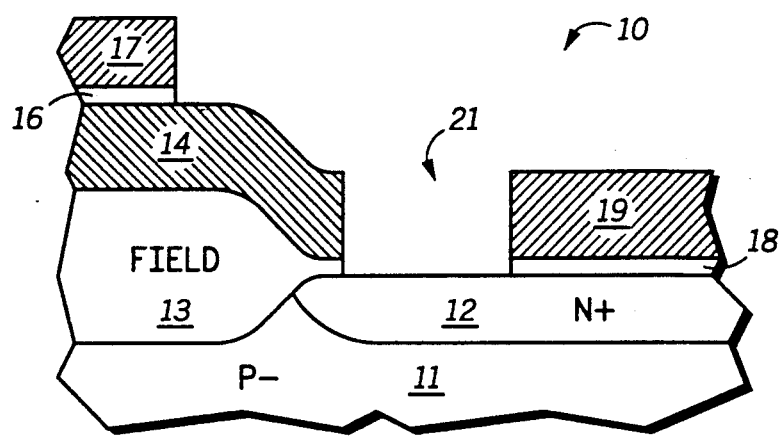
FIG.1 -PRIOR ART-
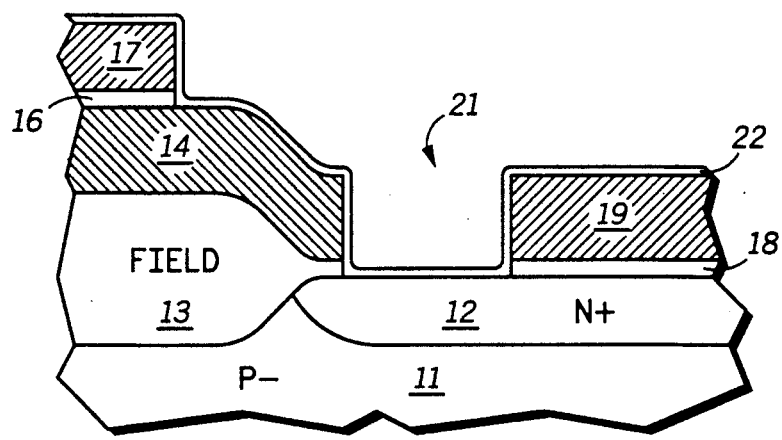
FIG.2
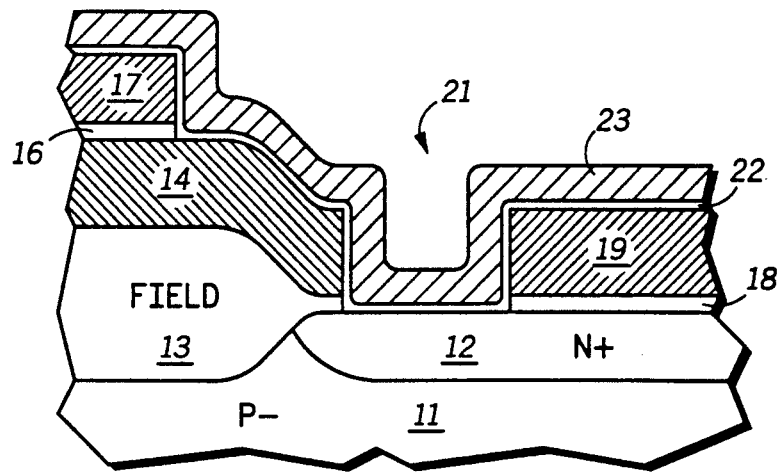
FIG.3

DEPOSITION OF A CONDUCTIVE LAYER FOR CONTACTS

FIELD OF THE INVENTION

The invention relates to semiconductor device structures, and more particularly, to the deposition of polysilicon in making contacts in forming a semiconductor device.

BACKGROUND OF THE INVENTION

Polysilicon is very significant in the manufacture of semiconductor devices. It has very significant uses as the gate of transistors, as interconnect, and as resistors. For use as interconnect, the polysilicon contacts various circuit elements which may require the polysilicon to contact a different layer of polysilicon and/or a semiconductor substrate. A contact between the substrate and a polysilicon layer is generally called a buried contact. A contact between two different polysilicon layers and the substrate is referred to as a shared contact. In both cases there is contact between polysilicon and the substrate which is virtually always monocrystalline silicon. The polysilicon to substrate contact is generally achieved by first exposing the portion of the substrate which is the location of the contact, then depositing a layer of polysilicon. The polysilicon is subsequently masked and etched to remove the polysilicon which is not wanted and to leave at least the portion polysilicon which was deposited on the exposed portion of the substrate. The polysilicon is thus in physical contact with the substrate at the contact location and thus forms the desired contact.

The layer of polysilicon which is deposited is almost certain to have other purposes than simply forming contacts to the substrate. For example, in the case static random access memories (SRAMs), each memory cell in the memory array generally has two loads which are generally formed from polysilicon. In such case, the layer of polysilicon must have very predictable electrical characteristics. In the case of polysilicon, one of the physical characteristics which has a significant impact on the electrical characteristics is the average grain size of the deposited layer. Thus, it is very important to be able to have consistent grain size for the polysilicon layer which is used for the resistors in the SRAM. In order to achieve this, the furnace which is used for the polysilicon deposition must be able to provide a specific temperature to all locations in the furnace where polysilicon is deposited. There are furnaces that can do this but there is a substantial amount of time required in order to achieve the desired temperature, within the narrow tolerance required, at all deposition locations in the furnace.

A natural consequence of having exposed monocrystalline silicon is the formation of a film, such as silicon dioxide (oxide), on the silicon. The exposed portion of the substrate for the contact is an example of this. The contact location is exposed by performing an etch. After performance of the etch the wafers, each of which contain many semiconductor devices, are cleaned in acid and washed in de-ionized water. Oxide formation begins immediately after the wafers have been cleaned by the acid. This oxide formation continues even after the wafers are placed in the furnace. Heat tends to increase the rate of formation of this undesired film of oxide. The oxide formation can continue until the polysilicon is deposited. The oxide formation is not necessarily uniform on the wafers or even on the same wafer or on different contact locations on the same substrate. The tendency, though, is to obtain more oxide as the wafers stay in the furnace prior to polysilicon deposition. The oxide increases the resistance of the contact formed by the subsequent polysilicon deposition. The contact resistance, if it is too great, can adversely affect circuit operation to the point that the circuit operates outside of some specified parameter. This has been found to cause yield loss even to the point of having to scrap whole wafers.

SUMMARY OF THE INVENTION

Accordingly, it is an object of the present invention to provide an improved process for depositing a film for use as a conductive layer on a semiconductor device.

Another object of the invention is to provide an improved method of making an semiconductor device having a conductive layer in contact with a substrate of the semiconductor device.

These and other objects are achieved in a method of making a semiconductor device which includes steps of providing a semiconductor substrate having a surface with an exposed portion, placing the substrate in a furnace, raising the temperature of the furnace, depositing a relatively thin layer of material for use as a conductor, stabilizing the temperature of the furnace, and depositing a relatively thick layer of material for use as a conductor on the relatively thin layer after the temperature of the furnace has been stabilized.

BRIEF DESCRIPTION OF THE DRAWINGS

FIG. 1 is a cross section of a portion a semiconductor device at a stage in processing according to the prior art;

FIG. 2 is a cross section of the portion of the semiconductor device of FIG. 1 at a subsequent stage in processing according to a preferred embodiment of the invention;

FIG. 3 is a cross section of the portion of the semiconductor device of FIG. 2 at a subsequent stage in processing according to a preferred embodiment of the invention.

DETAILED DESCRIPTION OF THE INVENTION

Figure 4:
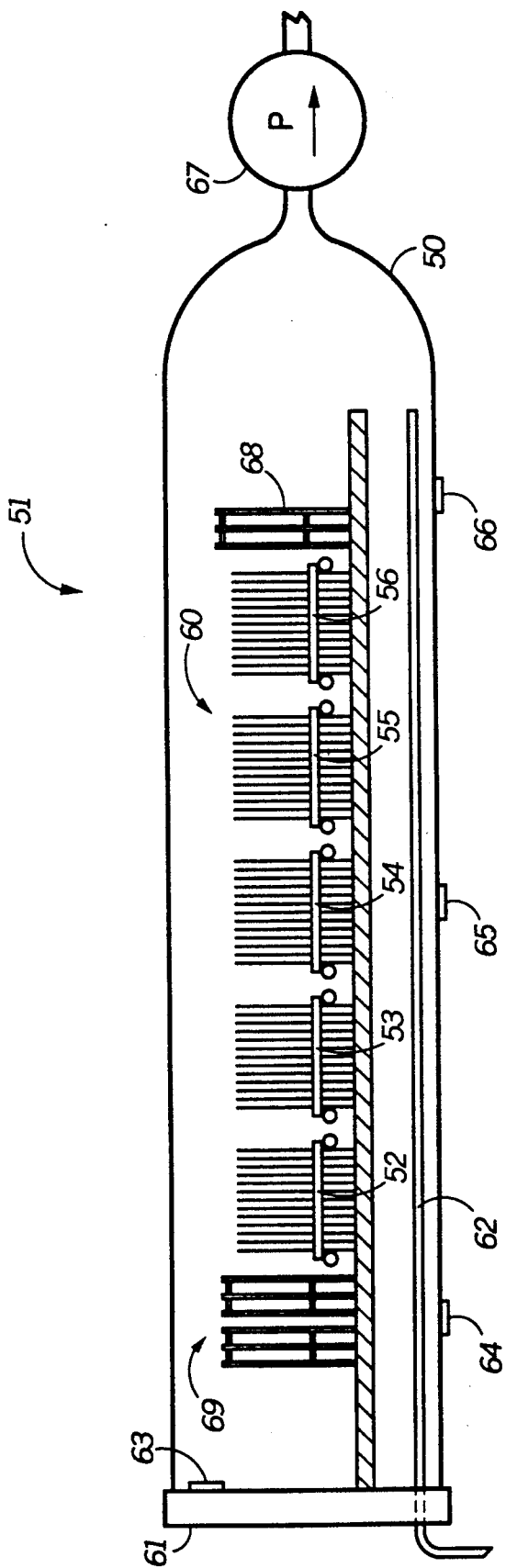
FIG. 4 is a diagram of a furnace with semiconductor wafers therein for use in practicing the preferred embodiment of the invention.

Shown in FIG. 1 is a portion 10 of a semiconductor device at a stage in processing according to a preferred embodiment of the invention having a substrate 11, a heavily-doped region 12, a field 13, a polysilicon portion 14 of a first polysilicon layer, a thermal oxide region 16 over polysilicon portion 14, a deposited oxide portion 17 over and coterminous with thermal oxide region 16, a thermal oxide region 18 over heavily-doped region 12 and spaced from field 13, and a deposited oxide region over and coterminous with thermal oxide region 18. An exposed portion 21 of substrate 11 is present on heavily-doped region 12 between field 13 and thermal oxide region 18. This is a common configuration in preparation for the formation of a shared contact. The shared contact will result from a subsequent deposition of polysilicon which will contact heavily-doped region 12 at exposed portion 21 which is not covered by thermal oxide region 16 and polysilicon portion 14.

After the configuration as shown in FIG. 1 is obtained, the wafer which contains portion 10 is cleaned with an acid such as hydrofluoric acid (HF) and rinsed with de-ionized water. Oxide begins forming on exposed portion 21. The wafer is inserted into a reaction furnace 50 as shown in FIG. 4. Shown in FIG. 4 is a manufacturing arrangement 51 which includes reaction furnace 50, boats 52, 53, 54, 55, and 56 inside reaction furnace 50. Each of boats 52-56 support a plurality of wafers 60 all of which have portions thereon which are the same as portion 10 of FIG. 1. Furnace 50 includes a door 61, a gas inlet tube 62 along the bottom of reaction furnace 50, a pressure gauge 63 on the door, a temperature gauge 64 on the bottom of reaction of reaction furnace 50 and near door 61, a temperature gauge 65 on the bottom near the middle of reaction chamber 50, a temperature gauge 66 on the bottom and near the end of reaction chamber 50 which is away from door 61, and a pump 67 at the end of reaction chamber 50 which is away from door 61. At each end of wafers 60 is a baffle. Such baffles 68 and 69 are shown in FIG. 4. After wafers 60 have been washed and rinsed, they are inserted into chamber 50 as shown in FIG. 4. Furnance 50 is immediately heated, and pump 67 begins evacuating gas from furnace 50. The normal objective is to reach a specific temperature with only a few degrees of variation within furnace 50 prior to depositing polysilicon. This typically takes more than an hour for furnace 50 to have the requisite uniformity of temperature. The target temperature may be, for example, 635° Celsius with an allowed variation of no more than plus or minus 2° and preferably less variation than that. An average temperature of 635° can be achieved in much less time than an hour but the variation within furnace 50 is much greater than plus or minus 2°. Each location where polysilicon is deposited is desirably within the 633° to 637° range. Thus, obtaining the requisite uniformity of temperature is what takes the most time. More time results in more oxide growth. More oxide results in a higher resistance contact. In the preferred embodiment of the invention, however, a thin layer of polysilicon is deposited prior to reaching the requisite temperature uniformity but also prior to excessive oxide growth. The remaining major portion of the polysilicon deposition is not performed until after the requisite temperature uniformity has been achieved.

After insertion of wafers 60 into furnace 50 and furnace 50 has been heated and evacuated for 10 minutes, the pressure is at about 10 milliTorr (mT). A leak check is then performed to ensure that a vacuum can be maintained. This leak check is performed for 1 minute. The pressure after the leak check is about 15 mT. The furnace is heated and evacuated for another 10 minutes which brings the furnace to a pressure of about 5 mT. This ensures system integrity for deposition of high integrity polysilicon. The temperature range within chamber 50 is about 610° to 640°. Silane is then introduced into furnace 50 via inlet tube 62 for a relatively short time which results in a thin polysilicon layer 22 of about 400 Angstroms over exposed portion 21 as well as the rest of the surface of portion 10. Polysilicon layer 22 would in fact be deposited over all of the wafer of which portion 10 is a part. Further, all of wafers 60 would be coated with a thin layer of polysilicon of the same thickness. The thickness of polysilicon layer is adjustable by adjusting the time of the silane flow. The pressure during this thin-layer polysilicon deposition is about 280 mT. After termination of the silane flow for the thin-layer deposition, furnace 50 continues heating and holding a vacuum for 50 more minutes in order to obtain the desired uniformity of temperature across wafers 60. After the requisite temperature uniformity has been obtained, silane is again flowed via inlet tube 62 to cause the deposition of a relatively thick polysilicon layer 23 of about 1300 Angstroms to obtain a polysilicon thickness of 1500 Angstroms for polysilicon layers 22 and 23 as shown in FIG. 3. The thickness of polysilicon layer 23 is also adjustable by adjusting the time and pressure of the silane flow. Polysilicon layers 22 and 23 are implanted which determines the conductivity of the polysilicon layers. The actual contact area is doped to a much higher concentration than the polysilicon which is used for resistors used in SRAMs. This is achieved with conventional masking techniques. The polysilicon as deposited is not actually a conductor but becomes a conductor after it has been doped. In this way polysilicon is commonly used as a conductor.

Thin layer 22 has been experimentally shown to be very beneficial in reducing contact resistance, and even more beneficial in providing uniformity of contact resistance among various contact locations within a particular wafer. The improvement in contact resistance and variation in contact resistance was shown by taking data from a first group of lots of wafers which were run using the process of first depositing polysilicon after the furnace had stabilized to the desired uniformity of temperature and a second group of lots using the process of the preferred embodiment of the invention in which there is first applied a thin layer of polysilicon prior to the desired temperature stabilization and a second thicker layer of polysilicon after the desired temperature stabilization. The total thickness of polysilicon was virtually the same for both lots and the same implant dosage was applied.

Contact resistance was measured at various locations on wafers near door 61 taken from each lot and on wafers near the end of furace 50 away from door 61 also taken from each lot. The resistance range was defined as the range of resistances of the middle 80%. The low resistance of the range was determined as the resistance of which 90% of the contacts were greater than. Similarly, the high resistance was determined as the resistance of which 90% of the contacts were less than. For the first group of lots, the wafers near door 61 had a resistance range of about 400 ohms to 1300 ohms and the wafers away from door 61 had a resistance range of about 450 ohms to 2950 ohms. There were some contacts that had a resistance of 3500 ohms for the wafers away from the door. For the second group of lots, the wafers near door 61 had a resistance range of about 250 ohms to 450 ohms centered at about 88 ohms, and the wafers away from door 61 had a resistance range of about 300 ohms to 600 ohms centered at about 92 ohms. The highest contact resistance for the second group of wafers was about 700 ohms. The preferred embodiment thus significantly improved contact resistance uniformity and at a relatively low resistance. The contact resistance is desirably low. One of the reasons for requiring the high level of temperature uniformity was for uniformity of resistance of the polysilicon layer from wafer to wafer. Experiments showed that the resistance of such resistors using the single step polysilicon deposition had a wafer-to-wafer variation of about plus or minus 20%. The method of the preferred embodiment actually produced resistors which had less wafer-to-wafer resistance variation than did the single step method. Thus, there was an improvement in the problem concerning contact resistance while still attaining the objective of the method of the prior art with respect to wafer-to-wafer uniformity of the resistance of resistors.

While the invention has been described in a specific embodiment, it will be apparent to those skilled in the art that the disclosed invention may be modified in numerous ways and may assume many embodiments other than those specifically set out and described above. For example, the application of a thin polysilicon layer followed by application of a thicker layer may not involve a shared contact but may be for a contact to the substrate only. Another example is that a conductive material other than polysilicon may be used for contacting the substrate. Accordingly, it is intended by the appended claims to cover all modifications of the invention which fall within the true spirit and scope of the invention.

We claim:

1. A method for making a semiconductor device structure, comprising:
   providing a semiconductor substrate having a surface with an exposed portion thereof;
   placing the substrate in a furnace, said furnace having a wafer area for receiving a plurality of semiconductor substrates;
   raising the temperature to all points within the wafer area to a first temperature range, said first temperature including a first temperature;
   depositing a relatively thin layer of material for use as a conductor on at least the exposed portion of the the surface of the substrate while all points within the wafer area are within the first temperature range;
   stabilizing the temperature to all points within the wafer area to a second temperature range, said second temperature range being narrower than said first temperature range, said second temperature range including the first temperature; and
   depositing a relatively thick layer of material for use as a conductor on the relatively thin layer of conductive material while all points within the wafer area are within the second temperature range.

2. The method for making the semiconductor device structure of claim 1, wherein the conductive material is polysilicon.

3. The method for making the semiconductor device structure of claim 1, further comprising the step of performing a leak test of the furnace prior to depositing said thin layer.

4. A method for making a semiconductor device structure, comprising:
   providing a semiconductor substrate having a surface with an exposed portion thereof;
   placing the substrate in a furnace;
   heating the furnace for a first time period so that at least a portion of the furnace reaches a first temperature;
   depositing a relatively thin layer of polysilicon on at least the exposed portion of the the surface of the substrate after the first time period;
   heating the furnace for a second time period without removing the semiconductor substrate from the furnace after depositing the relatively thin layer of polysilicon, said second time period being greater than said first time period so that the furnace at all points is at the first temperature within a small variation; and
   depositing a relatively thick layer of polysilicon on the relatively thin layer of polysilicon after the second time period.

5. The method of claim 4, further comprising the step of performing a leak test of the furnace after heating the furnace for the first time period.

6. The method of claim 5, further comprising the step of heating the furnace for a third time period after performing the leak test.

7. A method for making a semiconductor device structure, comprising:
   providing a semiconductor substrate having a surface with an exposed portion thereof;
   heating the substrate to within a first temperature range, said first temperature range including a first temperature;
   depositing a relatively thin layer of polysilicon on at least the exposed portion of the the surface of the substrate after the substrate was heated to within the first temperature range;
   stabilizing the temperature of the substrate to within a second temperature range, said second temperature range being narrower than said first temperature range, said second temperature range including the first temperature; and
   depositing a relatively thick layer of polysilicon on the relatively thin first layer of polysilicon after the temperature of the substrate has been stabilized within the second temperature range.

8. A method for making a semiconductor device structure, comprising:
   providing a semiconductor substrate having a surface with an exposed first portion thereof and a first layer for use as a conductor over and insulated from a second portion of the surface of the substrate;
   placing the substrate in a furnace, said furnace having a wafer area for receiving a plurality of semiconductor substrates;
   raising the temperature to all points within the wafer area to a first temperature range, said first temperature range including a first temperature;
   depositing a relatively thin layer of material for use as a conductor on at least the exposed first portion of the the surface of the substrate and on at least a portion of the first conductive layer after the temperature within the wafer area has been raised to the first temperature range;
   stabilizing the temperature to all points within the wafer area to a second temperature range, said second temperature range being narrower than said first temperature range, said second temperature range including the first temperature; and
   depositing a relatively thick layer of material for use as a conductor on said relatively thin layer after the temperature within the wafer area has been stabilized to the second temperature range.

9. The method for making the semiconductor device structure of claim 8, wherein the conductive material is polysilicon.

10. The method for making the semiconductor device structure of claim 9, further comprising the step of performing a leak test of the furnace prior to depositing said thin layer.

11. A method for making a semiconductor device structure, comprising:

provide a semiconductor substrate having a surface with an exposed first portion thereof and a first layer for use as a conductor over and insulated from a second portion of the surface of the substrate;

placing the substrate in a furnace;

heating the furnace for a first time period so at least a portion of the furnace is at a first temperature;

depositing a relatively thin layer of polysilicon on at least the exposed portion of the surface of the substrate and on at least a portion of said first layer;

heating the furnace for a second time period without removing the semiconductor substrate from the furnace after depositing the relatively thin layer of polysilicon, said secondn time period being greater than said first time period to stabilize the temperature within all points of the furnace within a small variation of the first temperature; and depositing a relatively thick layer of polysilicon on the relatively thin layer of polysilicon after the second time period.

12. The method of claim 11, further comprising the step of performing a leak test of the furnace after heating the furnace for the first time period.

13. The method of claim 12, further comprising the step of heating the furnace for a third time period after performing the leak test.

* * * * *